US012635515B2

(12) United States Patent
Santolaria et al.

(10) Patent No.: US 12,635,515 B2
(45) Date of Patent: May 19, 2026

(54) SEMICONDUCTOR POWER DEVICE, SEMICONDUCTOR POWER SYSTEM AND METHOD FOR COOLING A SEMICONDUCTOR POWER DEVICE

(71) Applicant: Hitachi Energy Ltd, Zürich (CH)

(72) Inventors: Lluis Santolaria, Olten (CH); Milad Maleki, Untersiggenthal (CH); Fabian Fischer, Baden (CH)

(73) Assignee: HITACHI ENERGY LTD, Zürich (CH)

( * ) Notice: Subject to any disclaimer, the term of this patent is extended or adjusted under 35 U.S.C. 154(b) by 192 days.

(21) Appl. No.: 18/121,911

(22) Filed: Mar. 15, 2023

(65) Prior Publication Data

US 2023/0335456 A1 Oct. 19, 2023

Related U.S. Application Data

(63) Continuation of application No. PCT/EP2022/060248, filed on Apr. 19, 2022.

(51) Int. Cl.
*H01L 23/367* (2006.01)
*H01L 21/56* (2006.01)
*H01L 23/473* (2006.01)

(52) U.S. Cl.
CPC .......... *H01L 23/3675* (2013.01); *H01L 21/56* (2013.01); *H01L 23/473* (2013.01)

(58) Field of Classification Search
CPC ................. H01L 23/3141; H01L 23/34; H01L 23/36–3675; H01L 23/3677;
(Continued)

(56) References Cited

U.S. PATENT DOCUMENTS 8,755,185 B2 * 6/2014 Chou ...................... H01L 24/33
165/80.4
9,072,197 B2 * 6/2015 Murata .............. H05K 7/20927
(Continued)

FOREIGN PATENT DOCUMENTS

CN 102655710 A 9/2012
CN 102655732 A 9/2012
(Continued)

OTHER PUBLICATIONS

JP-2008041806-A English Translation (Year: 2008).*

*Primary Examiner* — Amir A Jalali
(74) *Attorney, Agent, or Firm* — PROCOPIO, CORY, HARGREAVES & SAVITCH LLP

(57) ABSTRACT

A effective lower flow direction comprises power module and a housing that is arranged on an upper surface of the power module defining an upper flow section for liquid cooling of the power module in between. The upper flow section comprises an inlet, an outlet and a given upper flow path in between defining an effective upper flow direction. Further, a cooling unit is arranged on the lower surface of the power module defining a lower flow section for liquid cooling of the power module in between. The lower flow section comprises an inlet, an outlet and a given lower flow path in between defining an effective lower flow direction, such that during operation a coolant flows through the upper and the lower flow section providing a double-sided liquid cooling of the power module. The effective upper flow direction is different from the effective lower flow direction.

16 Claims, 5 Drawing Sheets

Figure 1:
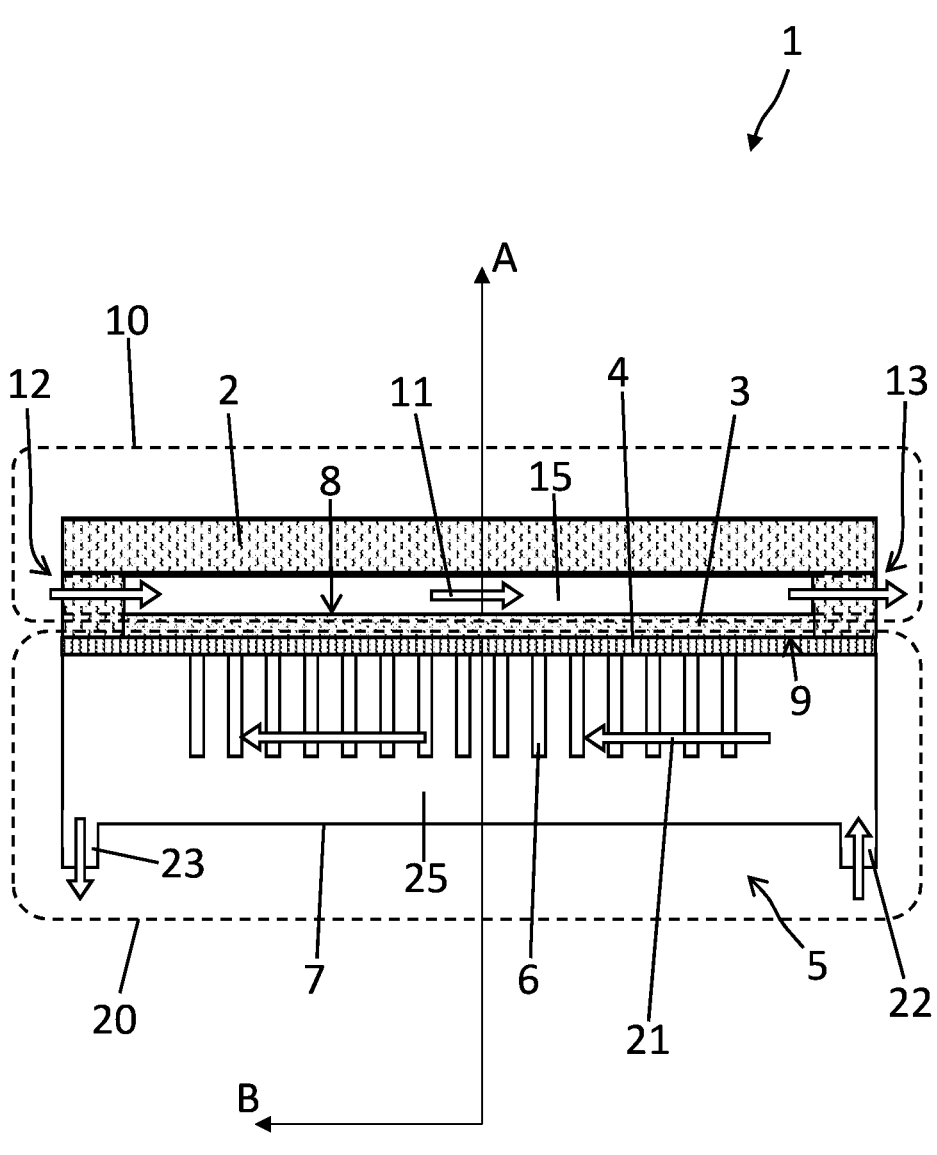

(58) Field of Classification Search
CPC ............. H01L 23/3736; H01L 23/3737; H01L 23/3738; H01L 23/40; H01L 23/4006; H01L 21/4882; H01L 21/56; H01L 2023/4043; H01L 2023/405; H01L 2023/4081; H01L 2023/4087; H05K 7/20254; H05K 7/20272; H05K 7/2029; H05K 7/20872; H05K 7/2089; H05K 7/20927; H05K 7/20936; H05K 2201/06; H05K 2201/10166; H05K 1/0203; G06F 1/20; H01H 9/52

See application file for complete search history.

(56)                    References Cited

U.S. PATENT DOCUMENTS

| | | | | | |
|---|---|---|---|---|---|
| 9,449,895 | B2 * | 9/2016 | Yoo | ........................ | H01L 23/473 |
| 11,232,995 | B2 * | 1/2022 | Matsuzawa | ......... | H01L 23/3677 |
| 11,324,148 | B2 * | 5/2022 | Hampo | ............... | H05K 1/0209 |
| 11,382,241 | B2 * | 7/2022 | Gao | .................. | H05K 7/20772 |
| 12,132,010 | B2 * | 10/2024 | Coppola | .............. | H02M 7/003 |
| 12,150,273 | B2 * | 11/2024 | Lee | .................. | H05K 7/20272 |
| 2009/0057882 | A1 * | 3/2009 | Gerbsch | ............... | H01L 25/115 |
| | | | | | 257/E23.098 |
| 2009/0178788 | A1 * | 7/2009 | Kimura | ................ | H01L 25/112 |
| | | | | | 165/104.33 |
| 2012/0001341 | A1 * | 1/2012 | Ide | ....................... | H01L 25/117 |
| | | | | | 257/773 |
| 2012/0212907 | A1 * | 8/2012 | Dede | .................. | H01L 23/4735 |
| | | | | | 361/689 |
| 2014/0158324 | A1 * | 6/2014 | Tochiyama | .......... | H01L 23/473 |
| | | | | | 165/67 |
| 2014/0327128 | A1 * | 11/2014 | Yoo | ......................... | H01L 23/29 |
| | | | | | 257/713 |
| 2016/0183407 | A1 * | 6/2016 | Katsumata | ............ | H05K 1/181 |
| | | | | | 361/699 |
| 2017/0133298 | A1 * | 5/2017 | Gutala | .................. | H01L 23/467 |
| 2017/0179001 | A1 * | 6/2017 | Brunschwiler | ....... | H01L 23/427 |
| 2017/0213779 | A1 * | 7/2017 | Ishiyama | .............. | H01L 23/473 |
| 2017/0336152 | A1 | 11/2017 | Jeong et al. | | |
| 2019/0259632 | A1 * | 8/2019 | Isaacs | ................. | H01L 23/3677 |
| 2019/0341327 | A1 * | 11/2019 | Teysseyre | .......... | H01L 23/3735 |
| 2020/0344920 | A1 * | 10/2020 | Lee | .......................... | H01L 23/44 |
| 2021/0337703 | A1 * | 10/2021 | Lee | ........................ | H01L 23/473 |
| 2022/0159871 | A1 * | 5/2022 | Pouilly | .............. | H05K 7/20272 |
| 2022/0319946 | A1 * | 10/2022 | Choi | .................... | H01L 25/072 |

FOREIGN PATENT DOCUMENTS

| | | | |
|---|---|---|---|
| CN | 209981199 | U | 1/2020 |
| DE | 102004057497 | A1 | 6/2006 |
| DE | 102020102927 | A1 | 8/2020 |
| EP | 1781076 | A2 | 5/2007 |
| EP | 2034521 | A2 | 3/2009 |
| JP | 2008041806 | A * | 2/2008 |
| JP | 2020025087 | A | 2/2020 |
| WO | 2015/086184 | A1 | 6/2015 |
| WO | 2015/140944 | A1 | 9/2015 |

* cited by examiner

SEMICONDUCTOR POWER DEVICE, SEMICONDUCTOR POWER SYSTEM AND METHOD FOR COOLING A SEMICONDUCTOR POWER DEVICE

The present application is a bypass continuation of International Patent Application No. PCT/EP2022/060248, filed on Apr. 19, 2022, which is hereby incorporated herein by reference as if set forth in full.

The present disclosure is related to a semiconductor power device and a method for cooling a semiconductor power device.

The present disclosure is further related to a corresponding semiconductor power system.

Power modules are used in automotive inverters for example and require a cooler for liquid cooling to dissipate heat during operation. Such coolers are fixed to the power modules and may require additional components to set up a stable connection and tight and reliable sealing.

There is a need to provide a semiconductor power device that improves and contributes to reliable and effective heat dissipation of a power module semiconductor power device during operation.

Embodiments of the disclosure relate to a semiconductor power device with a power module and a cooling concept that enables effective and reliable heat dissipation. Embodiments of the disclosure also relate to a corresponding method for cooling such a semiconductor power device and a corresponding semiconductor power system.

According to an embodiment, a semiconductor power device comprises a power module with an upper surface and a lower surface opposite to the upper surface. The semiconductor power device further comprises a housing that is arranged on the upper surface of the power module defining an upper flow section for liquid cooling of the power module between the power module and the housing. The upper flow section comprises an inlet, an outlet and a given upper flow path between the inlet and the outlet configured such that an effective upper flow direction is predefined. The semiconductor power device further comprises a cooling unit that is arranged on the lower surface of the power module defining a lower flow section for liquid cooling of the power module inside the cooling unit and/or between the power module and the cooling unit. The lower flow section comprises an inlet, an outlet and a given lower flow path between the inlet and the outlet configured such that an effective lower flow direction is predefined. The semiconductor power device is configured such that during operation a coolant flows through the upper and the lower flow section providing a double-sided liquid cooling of the power module, wherein the effective upper flow direction is different from the effective lower flow direction.

By use of the described configuration a semiconductor power device is feasible that contributes to reliable and effective heat dissipation during operation of the power module. Inter alia, the semiconductor power device is suitable for power modules for use in high voltage applications, for example for a voltage of at least 0.5 kV. The described upper structure with the housing and the upper flow path inside the housing can also be assembled to complement existing power packages to enable a double-sided liquid cooling of a respective power module.

The power module generally comprises electronics which may include terminals, chips, integrated circuits and/or other discrete devices. Chips or other devices are typically mounted, e.g. to an isolating substrate, an insulated metal baseplate, a printed circuit board, or a leadframe of the power module. Especially, the electronics can comprise power semiconductor chips like IGBT, power MOSFETs, JFETs, HEMTs, and/or diodes. The described substrate setups are then optionally mounted to a baseplate or are incorporating the baseplate (e.g. in the case of an insulated metal baseplate); it is also possible, that no baseplate is used and the backside of the substrate is in direct contact with the cooling medium.

It is a finding in the context of the present disclosure that for example a maximum chip temperature and consequently a capability of heat dissipation is a limiting factor for the current capability of conventional power semiconductor modules in an application. A high current capability reduces the needed number of power modules in a customer application. Alternatively, the number of chips in a power module, which are very expensive in the case of silicon carbide devices, for example, can be reduced to achieve a cost-down of the power modules. However, a reliable heat dissipation can be achieved by power semiconductor modules for example by means of a specific baseplate structure mounted or coupled to a cooler. The baseplate can form a part of the power module. Nevertheless, in conventional concepts heat dissipation merely occurs on a backside of the baseplate, so that the thermal path is comparably long.

Due to the described configuration of the semiconductor power device a double-sided cooling of the power module even with only one single cooler is feasible at low costs, for example in contrast to a setup, where double-sided cooling is realized by an arrangement of modules between two coolers or cooling paths. The upper and lower flow sections enable efficient heat dissipation not only on the underside or backside but also on the top side of the power module The upper and lower flow sections, flow paths and flow directions are related to positions and/or orientations with respect to an assembled state and a corresponding stacking direction of the parts of the semiconductor power device. Thus, the stacking direction may realize a vertical direction of the semiconductor power device ready for operation, whereas lateral directions then may realize directions perpendicular to the stacking direction.

According to an embodiment, the upper and lower flow sections are configured such that the effective upper flow direction and the effective lower flow direction are opposite or anti-parallel in sections, at least. Alternatively or additionally, the effective upper and lower flow direction may differ from each other such that they are perpendicular in sections, at least. The effective upper and the effective lower flow direction may be defined by the direction of the main volume flow of a corresponding cooling liquid flowing through the respective flow paths. Alternatively or additionally, the effective upper and the effective lower flow direction may be defined by a direction related to a cooling weighted average of a coolant flowing through the respective flow paths. Alternatively or additionally, the effective upper and the effective lower flow direction may be defined by the positions of the corresponding inlets and outlets of the associated upper and lower flow sections.

However, there may be portions in the upper flow section and in the lower flow section which have the same flow direction basically. But predominantly, the effective upper flow direction is different from the effective lower flow direction. For example, the effective flow directions of the upper and the lower path differ by minimum 90°. However, alternative angles below 90° between the effective upper flow direction and the effective lower flow direction are possible as well.

According to a further embodiment of the semiconductor power device, the inlet of the upper flow section and the outlet of the lower flow section are fluidically connected with each other. Thus, the upper flow path and the lower flow path can realize a common continuous flow channel for a coolant to dissipate heat from the power module during operation. For example, the inlet of the lower flow section and the outlet of the upper flow section are arranged at the same side of the semiconductor power device such that the upper flow path and the lower flow path substantially form a U-shaped flow channel. For example, the power module comprises a baseplate or a substrate or is supported by a baseplate or a substrate and the inlet into the upper flow path and the outlet out of the lower flow path is formed by an opening or recess, for example in form of a drilling, penetrating the baseplate or substrate at a predetermined position. Alternatively, the upper flow path and the lower flow path can realize respective flow channels separated from each other fluidically.

In view of the aforementioned stacking direction and with respect to a side view along one of the lateral directions, the coolant can enter the lower flow section through its inlet at a right sidewall of a housing of the cooling unit, for example, and can exit the lower flow section through its outlet at or next to a left sidewall or at the left directed upwards entering the upper flow section. The aforementioned or another coolant can enter the upper flow section through its inlet which may be formed at a left sidewall or coming from below through the outlet of the lower flow section, for example, and can exit the upper flow section through its outlet which may be formed at or next to a right sidewall of the semiconductor power device. Thus, the effective lower flow direction points to the left, whereas the effective upper flow direction points to the right. If the outlet of the lower flow section forms the inlet of the upper flow section the effective flow direction of the coolant undergoes a change of direction and the effective lower and upper flow directions are anti-parallel or opposite.

According to a further embodiment, the semiconductor power device comprises a cooling structure with at least one of a pin-fin area, ribs, a skived structure and meander channels that is arranged inside the upper flow path and/or the lower flow path. Such additional cooling structures contributes to a surface enhancement and/or a formation of intended turbulent flow, for example, and can beneficially affect the heat dissipation.

According to a further embodiment of the semiconductor power device the upper flow path comprises a flow channel with a height that is at least 10% of a height of a flow channel of the lower flow path with respect to the stacking direction of the semiconductor power device which points from the lower flow section towards the upper flow section, for example. Alternatively or additionally, the dimensions of the flow channels of the upper and the lower flow sections can be put in relation to each other in terms of a width, a length, a volume and/or a mass flow of coolant flowing through the respective flow channels. For example, the one or more flow channels of the upper flow path are basically equal to the one or more flow channels of the lower flow path in terms of one or more of the aforementioned characteristics.

According to a further embodiment of the semiconductor power device the housing is formed as a resin and/or gel encapsulation enclosing the power module and wherein the upper flow path is formed embedded in the encapsulation. The housing can be formed as a resin body of molded or potted resin or gel and thereby forming a molded power package realizing an upper portion of the semiconductor power device. The encapsulation can realize the housing with a frame and a cover forming a cavity, which is filled by gel or resin, for example in a potting process. Alternatively, the encapsulation or the housing can be realized as a molded package, where the encapsulation is formed by a resin material in a molding process, for example by means of transfer molding. The upper flow path can comprise one or more flow channels forming a predetermined pipeline system directly inside the encapsulation. Alternatively or additionally, the upper flow path can comprise guiding elements such as walls, plates, tubes and/or a housing elements forming a predetermined flow direction.

According to a further embodiment of the semiconductor power device, the upper flow path and/or the lower flow path are limited by walls comprising at least one of copper, copper alloy, aluminum and aluminum alloy. For example, a housing of the cooler unit at the lower portion of the semiconductor power device is made of aluminum and the upper flow path comprises one or more flow channels forming a pipeline system made of copper. The upper flow path is electrically isolated from the substrate or chips, for example by isolating elements or sheets in between or by the upper flow path made of electrically isolating material.

According to a further embodiment of the semiconductor power device, the power module comprises electronics like chips and a substrate metallization and an isolating ceramic sheet, and the upper flow path is configured such that during operation a coolant is in thermal contact with at least one of the electronics and the substrate metallization. Due to a close or direct contact with heated elements the heat dissipation can be performed beneficially. For example, the upper flow path realizes or comprises a cooling flow channel getting in thermal and/or mechanical contact with chip surfaces or corresponding planar connections or with a surface of a substrate metallization or isolating sheet made of ceramic or resin of the power module to dissipate heat. Such an upper cooling channel may also allow to cool thermally critical portions of terminals.

According to a further embodiment of the semiconductor power device, the upper flow path comprises at least two flow channels separated from each other. Additionally, there can be an isolating element arranged to separate two adjacent flow channels. For example, there can be sheets of isolating material being arranged between additional cooling flow channels of the upper flow path and parts of the power module. Thus, a secure heat dissipation is enabled. Moreover, a respective isolating interface can be arranged between upper cooling paths and the substrate or chips below being in contact. Alternatively or additionally, the upper cooling channel may be made of isolating material itself.

According to a further embodiment of the semiconductor power device, the upper flow section is configured such that a ceiling wall of the upper flow path is exposed from the housing. For example, a top surface of an additional cooling flow channel the upper flow section is exposed from or protrudes above a package body of a molded power module which can further contribute to effective and reliable heat dissipation. Alternatively or additionally, the upper flow paths can be arranged on a top of the housing such that the upper flow path may be in contact with an exposed portion of a heat sink or a terminal especially in a molded power package.

According to an embodiment, a semiconductor power system comprises a first embodiment of the described semiconductor power device, and a second embodiment of the described semiconductor power device. The respective upper flow sections and lower flow sections of the first and the second semiconductor power device are fluidically connected with each other. The semiconductor power system can also comprise a third or more further embodiments of the described semiconductor power device fluidically coupled to the others to form a continuous upper flow path and a lower flow path or upper flow section and lower flow section, respectively.

According to an embodiment of the semiconductor power system, the lower flow section of the first semiconductor power device is fluidically connected to the lower flow section of the second semiconductor power device. The lower flow section of the second semiconductor power device is further fluidically connected to the upper flow section of the second semiconductor power device, and the upper flow section of the second semiconductor power device is fluidically connected to the upper flow section of the first semiconductor power device. Thus, the respective upper flow sections and lower flow sections of the first and the second semiconductor power device can form a fluidic series loop or connection.

According to a further embodiment of the semiconductor power system, the respective cooling unit of the first and the second semiconductor power device are formed as a common continuous cooler such that the lower flow sections of the first and the second semiconductor power device form a common lower flow section. The respective upper flow sections of the first and the second semiconductor power device are fluidically connected to each other by means of a flow connecting section and one or more sealing member, for example in form of O-rings. Each of the semiconductor power devices can be encapsulated to an own or a common module housing or encapsulation.

According to an embodiment, a method for cooling an embodiment of the described semiconductor power device comprises providing at least one coolant for liquid cooling of the power module, and feeding the at least one coolant into the lower flow path of the lower flow section. The method further comprises feeding the at least one coolant or a further coolant into the upper flow path of the upper flow section, such that during operation the respective coolant flows through the lower and the upper flow section and provides a double-sided liquid cooling of the power module, wherein the effective upper flow direction is different from the effective lower flow direction.

As a result of that the described semiconductor system and the described cooling method comprise or are related to cool an embodiment of the semiconductor power device, described features and characteristics of the semiconductor power device are also disclosed with respect to the semiconductor system and the cooling method and vice versa.

The described embodiments of the semiconductor power device and the integration of one or more additional flow channels for liquid cooling enable one or more of the following benefits for manufactures but also for costumers:
- a significant reduction of a thermal resistance of the power module resulting in an improved heat dissipation. Consequently, a current capability of the power module at a given maximum chip temperature is apparently higher. Consequently, a number of power modules needed in a customer application can be reduced, and/or a number of chips being integrated in the power module can be reduced. This can further lead to either an increase of reliability and/or, a cost decrease.
- because of the different, for example anti-parallel, coolant flow direction in the main flow path realizes by the lower flow path and the additional upper flow path, chip temperatures inside the power module itself, but also of multiple power modules being arranged in a row, for example, are equalized or more homogeneous, with respect to the temperature difference between hottest and coldest chips in the arrangement of power modules of a semiconductor power system. the temperature of the hottest chip in a power module or in an arrangement of multiple power modules limiting the maximum applied power can be reduced.
- more added value on a cooler product is available resulting in an increased utility for customers and therefore business protection.

The proposed structure of the semiconductor power device is compatible with and can be added to conventional devices. For example, a cooper metallization can be attached to a top surface of a ceramic substrate of a power module to form upper flow channels by means of internal ceramic channel and the copper metallization. Thus, the described semiconductor power device according to the present disclosure is applicable for several existing and future products especially in the field of automotive products for E-mobility like single modules or a six-pack setup, and next generations of coolers.

Figure 2:
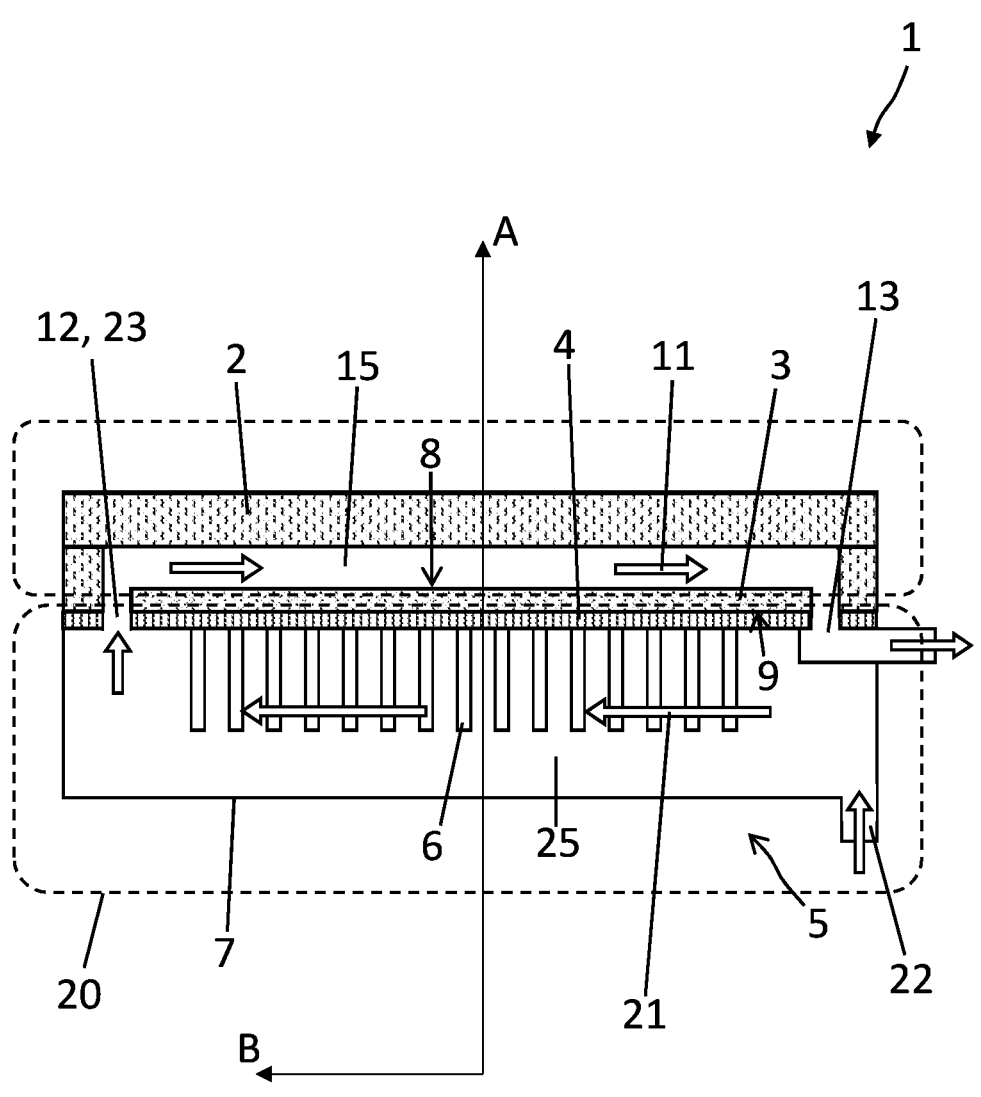
Figure 3:
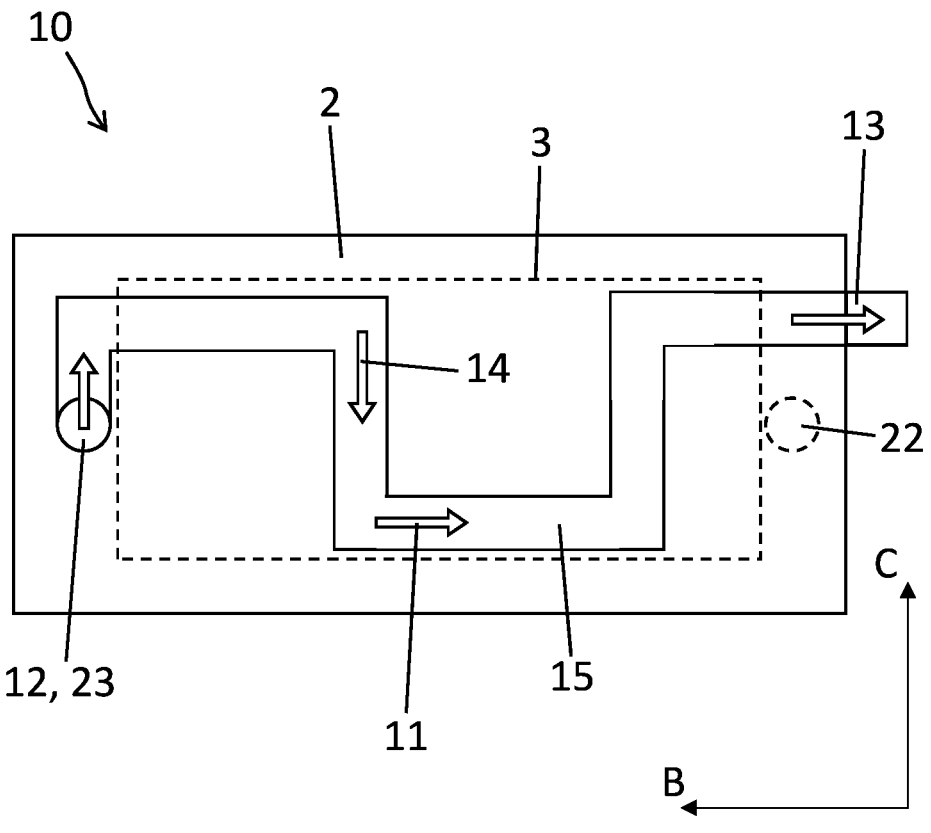
Figure 4:
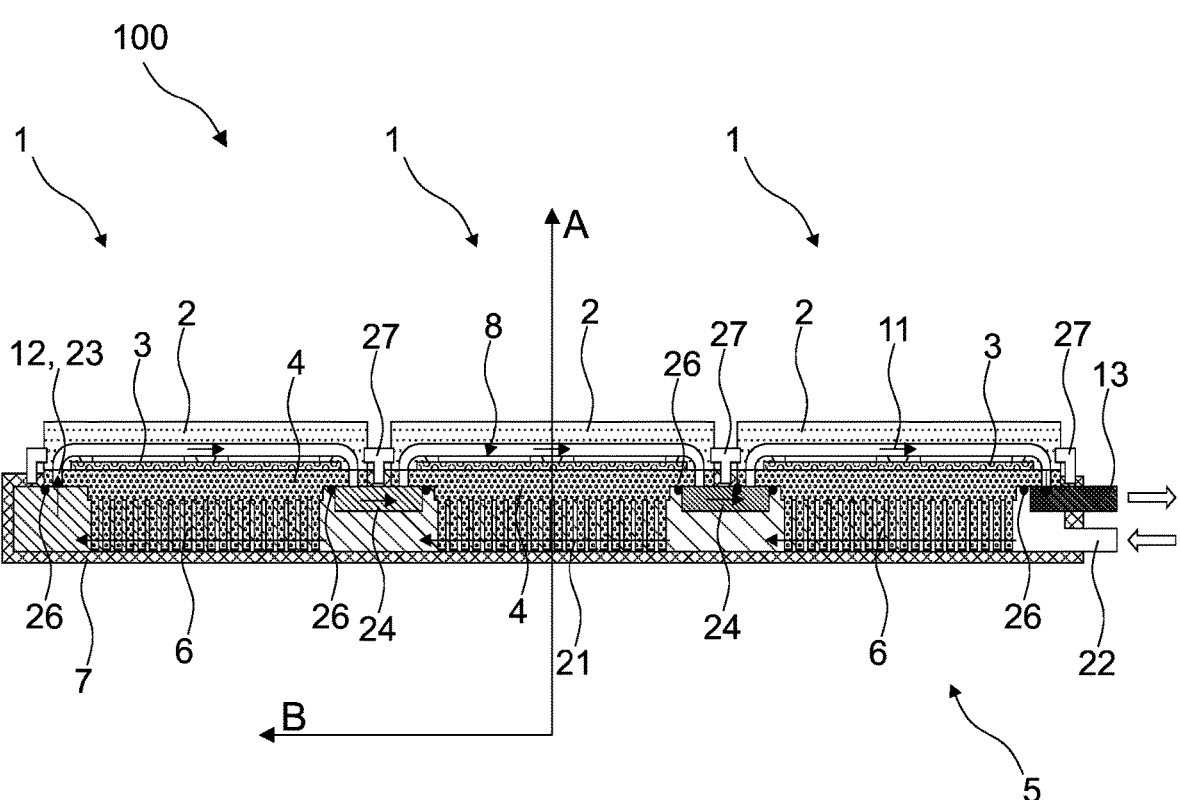
Figure 5:
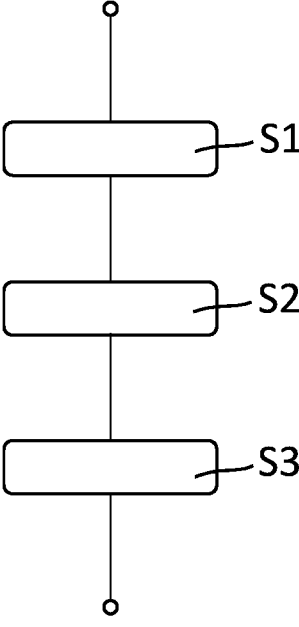

Exemplary embodiments are explained in the following with the aid of schematic drawings and reference numbers. The figures show:

FIG. 1 an embodiment of a semiconductor power device in a schematic cross section side view;

FIG. 2 a further embodiment of a semiconductor power device in a schematic cross section side view;

FIG. 3 an embodiment of a semiconductor power device in a schematic top view;

FIG. 4 an embodiment of a semiconductor power system in a schematic cross section side view; and FIG. 5 a flow chart for a method for cooling a semiconductor power device according to the FIGS. 1-4.

The accompanying figures are included to provide a further understanding. It is to be understood that the embodiments shown in the figures are illustrative representations and are not necessarily drawn to scale. Identical reference numbers designate elements or components with identical functions. In so far as elements or components correspond to one another in terms of their function in the figures, the description thereof is not repeated for each of the following figures. For the sake of clarity elements might not appear with corresponding reference symbols in all figures possibly.

FIG. 1 illustrates an embodiment of a semiconductor power device 1 in a schematic cross section side view. The semiconductor power device 1 comprises a power module 3 with an upper surface 8 and a lower surface 9 opposite to the upper surface 8. The semiconductor power device 1 further comprises a housing in form of an encapsulation 2 that is arranged on the upper surface 8 of the power module 3 defining an upper flow section 10 for liquid cooling of the power module 3 between the power module 3 and the encapsulation 2. The upper flow section 10 comprises an inlet 12, an outlet 13 and a given upper flow path 15 between the inlet 12 and the outlet 13 configured such that an effective upper flow direction 11 is predefined.

The semiconductor power device 1 further comprises a cooling unit 5 with a housing 7 that is coupled to the lower surface 9 of the power module 3 defining a lower flow section 20 for liquid cooling of the power module 3 inside the cooling unit and/or between the power module 3 and the cooling unit 5. The lower flow section 20 comprises an inlet 22, an outlet 23 and a given lower flow path 25 between the inlet 22 and the outlet 23 configured such that an effective lower flow direction 25 is predefined. The semiconductor power device 1 is configured such that during operation a respective coolant flows through the upper and the lower flow path 15, 25 providing a double-sided liquid cooling of the power module 3, wherein the effective upper flow direction 11 is different from the effective lower flow direction 21.

A sectional flow direction of the coolant is illustrated at some exemplary positions in the FIGS. 1-4 using broadly-drawn arrows. The effective upper and lower flow directions 11, 21 are different mostly. There may be portions in the upper flow section 10 and in the lower flow section 20 which have the same flow direction basically. But predominantly, the effective upper flow direction 11 is different from the effective lower flow direction 12. According to the illustrated embodiments in the FIGS. 1-2 and 4, the effective upper and lower flow directions 11, 21 are anti-parallel or opposite. According to the illustrated embodiment in FIG. 3, the effective upper and lower flow directions 11, 21 can also be perpendicular to each other and/or anti-parallel or opposite in sections, at least.

Terms like "upper", "lower", "top", "bottom", "side" are used to refer to positions and/or orientations as illustrated in the figures and with respect to the drawn in stacking direction A. The stacking direction A may realize a vertical direction of the semiconductor power device 1 ready for operation, whereas lateral directions B and C realize directions perpendicular to the stacking direction A.

FIG. 1 shows the inlet 12 and the outlet 13 of the upper flow section 10 formed as openings or recesses penetrating a respective sidewall of the encapsulation 2. The upper and the lower flow sections 10, 20 can realize separate cooling circuits. A first coolant for the lower flow section 20 can enter the lower flow path 25 through the inlet 22 upwards along the stacking direction A. Then the first coolant flows along the effective lower flow direction 21 dissipating heat from the bottom of the power module 3 or a baseplate 4 the power module 3 is assembled on. In FIG. 2 the effective lower flow direction 21 points from the right to the left along the lateral direction B and a main plane of extent of the semiconductor power device 1. The baseplate 4 can realize a part of the power module 3, a part of the cooling unit 5 or a separate element in between. The baseplate 4 comprises a pin-fin structure 6 for enhancing the surface to dissipate heat and/or to provide a desired turbulent flow of the first coolant, for example. A turbulent flow usually provides better heat transition from a surface to a coolant than a laminar flow does. The first coolant can exit the housing 7 of the cooling unit 5 through the outlet 23 downwards.

A second coolant for the upper flow section 10 can enter the upper flow path 15 through the inlet 12 through the left sidewall of the encapsulation 2. Then the second coolant flows along the effective upper flow direction 11 dissipating heat from the top of the power module 3. In FIG. 2 the effective upper flow direction 11 points from the left to the right opposite the illustrated lateral direction B and anti-parallel to the effective lower flow direction 21.

The upper flow path 15 can also comprise an internal cooling structure in form of a pin-fin, ribs or meander channel area for enhancing the surface to dissipate heat and/or to provide a desired turbulent flow of the second coolant, for example. The second coolant can then exit the encapsulation 2 through the outlet 13 in the right sidewall.

FIG. 2 shows a further embodiment of the semiconductor power device 1 in a schematic cross section side view. In difference to the embodiment of as illustrated in FIG. 1, the semiconductor power device 1 according to FIG. 2 merely needs one coolant flowing through both, the upper and the lower flow path 15, 25. The power module 3 is arranged on the cooler unit 5 and the upper flow path 15 realizes an additional internal flow channel located above the baseplate 4 or the power module 3, which is directly connected with the lower flow path 25 which realizes a main flow channel of the cooling concept. The effective upper and lower flow directions 11, 21 of the coolant are anti-parallel. The inlet 22 of the lower flow section 20 and the outlet 13 of the upper flow section 10 are fluidically connected and can be arranged at different sides of the semiconductor power device 1 or at the same side forming a U-style flow channel through the semiconductor power device 1 (s. FIG. 4).

The upper and/or the lower flow path 15, 25 can have a straight or a meander shape, for example. FIG. 3 illustrates in a schematic top view a possible flow guidance of the coolant in the upper flow path 15 which can be realized in an embodiment of the semiconductor power device 1 as show in FIG. 2, for example. Thus, FIG. 3 shows the main plane of extent in the lateral directions B and C viewing along the stacking direction A. The effective upper flow direction 11 point from the left to the right, for example defined by the inlet 12, and the outlet 13. The effective upper and the effective lower flow directions 11, 21 may be defined by the direction of the main volume or mass flow of the coolant flowing through the respective upper and lower flow paths 15, 25. However, there are also sectional flow directions 14 pointing down or up in the illustrated view of FIG. 3, but predominantly, the effective upper flow direction 15 points from the left to the right and is different from the effective lower flow direction 25.

It is a finding of the present disclosure that when cooling the power module 3 by liquid cooling, it should be considered that the coolant is heated by the heat dissipation of the power module 3. Consequently, with respect to a streaming or flow direction of the coolant a front portion of the power module 3 or a first power module 3 in a row of multiple power modules, has a better heat dissipation compared with a rear portion or a last power module 3 in a row because of the lower temperature of the coolant. For example, referring to FIG. 2 the coolant entering the lower flow section 20 through the inlet 22 is colder than it is at the outlet 23. Thus, in view of the illustrated orientation the right side of the lower surface 9 of the power module 3 is cooled more strongly than the left side of the lower surface 9 of the power module 3.

Such a negative effect of temperature inhomogeneity would be even stronger, if there are several flow channels but their corresponding effective flow directions of the coolant would only be parallel. However, this effect can be partly compensated at least by use of a cooling concept as illustrated and described with respect to the embodiments of the semiconductor power device 1 due to the configuration of anti-parallel effective upper and lower flow directions 11, 21 of one or more coolants. Thus, in the upper flow path 15 the thermally disadvantageous chips or power modules with respect to the lower flow path 25 are provided with colder coolant than it would be the case using parallel streaming.

The differently directed upper flow path 15 realizes an additional internal channel for coolant flow and can be arranged in the power module interior. According to FIG. 2 the upper flow path 15 is connected by openings in the baseplate 4 with the lower flow path 25 of the cooling unit 5 on a backside of the power module 3. The upper flow path 15 can comprise one or more flow channels which are which may have one or more portions being in thermal and/or mechanical contact with chip surfaces and/or parts of a substrate surface dependent on a presence of wirebond connections of the power module 3.

Sheets of electrically isolating and heat conductive material can be arranged for a thermal interface and an electrical isolation between the one or more internal flow channels of the upper flow path 15 and other power module parts. The upper cooling flow path 15 may be alternatively or additionally made of isolating material. The upper flow path 15 may be realized by one broad single flow channel or by several smaller flow channels. The at least one upper flow channel may be made of copper, aluminum, or a corresponding alloy. The upper flow channel may be embedded into a resin body of the power module 3 forming a molded power package. Alternatively or additionally, the at least one upper flow channel can be formed into the resin or gel encapsulation 2 of the power module 3 being filled by potting, for example.

The at least one upper flow channel may also have internal cooling structures like ribs, pin-fins or skived pins.

The described cooling concept of the semiconductor power device 1 does not need changes of a power module outline. Only minor changes of a module design are implemented:

improved cooling performance is achieved, if the upper cooling flow channel of the upper flow path 15 gets in mechanical and thermal contact with chip surfaces. Here wirebond connections can be replaced by planar contacts like clips or leadframes. Otherwise, if wirebond connections cannot be replaced, the one or more upper flow channels can be arranged besides a chip and have mechanical and thermal contact with metallization or ceramic portions of the substrate of the power module 3. Such an upper cooling channel may also allow to cool thermally critical portions of the terminals A modification of the baseplate 4 enables to provide feedthroughs for one single coolant supply for the lower flow section 20 and the upper flow section 10. A corresponding modification can also be used for the outlet 13 of the upper flow path 15.

Changes of an internal design of the lower cooling unit 5 can be implemented. On the one hand, the cooling unit 5 can facilitate the inlet 22 and the outlet 23 for the lower flow path 25 and also the inlet for the upper flow path 15 through the at least one upper flow channel (see FIGS. 2 and 4). On the other hand, if several power modules 3 are arranged forming a six-pack module, a serial connection of respective upper flow paths 15 and upper flow channels of the multiple power modules 3 can be realized using flow connecting sections 24 and sealing members 26, for example between baseplates and flow connecting members (see FIG. 4).

Finally, depending on pump needs, a larger height of a molded body of the encapsulation 2 may be needed to ensure reasonable flow velocities and therefore a reasonable pressure drop.

An even improved heat dissipation of the power module 3 with the upper flow path 15 above the upper surface 8 can be achieved if a top surface of the at least one upper flow channel is exposed from the body of a molded power package or the encapsulation 2 of the semiconductor device 1. Such a setup of the semiconductor device 1 can combine advantages of a power module with a pin-fin baseplate having an additional cooling channel with advantages of double-sided cooling, wherein the cooling paths provide two cooling interfaces. This would not imply a significant design change for customers, the upper flow path 15 can realize a cooler for capacitors or control electronics arranged on a top side of the power modules 3 of the semiconductor device 1 in the same area in an application.

The described double-sided cooling concept with different effective upper and lower flow directions 11, 21 allows for an efficient additional cooling on the top surface 8 of the power module 3, where a main portion of the heat dissipation is provided by a backside or bottom surface of the 4 baseplate having a pin-fin structure. Alternatively or additionally, a molded power package may have terminal portions being exposed from a package body, which get in contact with the cooling path. The described double-sided cooling concept can be implemented to an existing module design for a single-sided cooling without any modification of the outline of the power package. Consequently, no second cooler or additional flow path is needed and no major modifications of a cooling circuit itself, but also of the connections between power module and cooler are needed.

FIG. 4 illustrates an embodiment of a semiconductor power system 100 in a schematic cross section side view. The semiconductor power system 100 comprises three semiconductor power devices 1 and might be also called a six-pack module with additional upper cooling sections, where three half-bridge modules are mounted on the cooling unit 5 in a row. The respective power modules 3 are thermally connected in series. The inlet 22 and the outlet 13 of the semiconductor power system 100 are arranged at the same side forming a U-style cooling flow. One common cooling unit 5 provides the lower flow path 25 for the power modules 3. The respective upper flow sections 10 of the semiconductor power devices 1 are fluidically connected to each other by means of flow connecting sections 24 and sealing members 26 between baseplates and flow connection members.

The outlet 23 of the lower flow section 20 forms the inlet 12 to the upper flow section 10. The outlet of the first upper flow section of the semiconductor power device 1 on the very left serves as the inlet to the first flow connecting section 24 and the inlet of the semiconductor power device 1 in the middle. The outlet of the second upper flow section of the semiconductor power device 1 in the middle serves as the inlet to the second flow connecting section 24 and the inlet of the semiconductor power device 1 on the very right. In view of a temperature of the coolant, the coldest fluid temperatures are present operationally at the inlet 22 on the bottom right and hottest fluid temperatures are present operationally at the outlet 13 of the top right. In FIG. 4, the temperature increase of the coolant is indicated by a densifying line hatching. So the left power module 3, which is most disadvantageous with respect to the lower flow path 25 is dedicated to most advantageous thermal situation in the upper flow path 15.

Alternatively, the semiconductor power system 100 can comprise two or four or more power modules 3 being thermally arranged in series and/or parallel to each other. Individual upper flow channels and inlets and outlets for all power modules 3 can be mounted on or in the cooling unit 5. The flow channels in the lower and/or upper flow section(s) 10, 20 can form one common cooling path, where the flow channels of at least a part of the multiple power modules 3 are thermally connected in series and have only one inlet and one outlet at the beginning and at the end of the common additional cooling channel.

The cooling setup of the semiconductor power system 100 with opposite or anti-parallel effective upper and lower flow directions 11, 21 may be realized by different ways:

all power modules 3 individually comprise an upper flow section 10 with an upper flow path 15. Inlet 12 and outlet 13 of the upper flow paths 15 of each power module 3 are in direct contact with the lower flow path 25 of the cooling unit 5, or an outlet flow is led towards a common outlet of the cooling unit 5.

the additional upper flow path(s) 15 of the multiple power modules 3 can be mounted on the cooling unit 5 and can be arranged in series forming a common flow path. This common flow path providing a coolant flow in anti-parallel direction with respect to the effective lower flow direction 21 in the lower flow path 25 spans over a complete length of the arrangement of power modules 3.

The upper flow path 15 begins at a hotter end of the cooling unit 5 and has the outlet 13 at the beginning of the cooling unit 5. So the cooling liquid first flows through the lower flow path 25 in the cooling unit 5 along all three power modules 3. Then the coolant flows through the additional cooling path through the three power modules back to the beginning of the cooler. Consequently, inlet 22 and outlet 13 of the common cooling path of the semiconductor power system 100 are at the same side at the beginning of the cooling unit 5 (U-style). Here modifications of the cooling unit 5 can be implemented for the connections of the lower flow paths 15 of the single power modules 3 without any exchange of the coolant with the coolant of the lower flow path 25 at interfaces between the power modules 3.

Steps of a corresponding operating method for cooling the semiconductor power device 1 or one semiconductor power device 1 of the semiconductor power system 100 can follow the flow chart as shown in FIG. 5. In a step S1 the coolant for liquid cooling of the power module(s) 3 is provided.

In a step S2 feeding the coolant into the lower flow path 25 of the lower flow section 20 is performed.

In a step S3 feeding the feeding the coolant into the upper flow path 15 of the upper flow section 10 is performed, such that during operation the respective coolant flows through the lower and the upper flow section 20, 10 and provides a double-sided liquid cooling of the power module(s) 3, wherein the effective upper flow direction 11 is different from the effective lower flow direction 21.

By use of the described configurations the semiconductor power device 1 and the semiconductor power system 100 can contribute to reliable and effective heat dissipation during operation of the power module(s) 3.

The embodiments shown in or described by the FIGS. 1 to 5 as stated represent exemplary embodiments of the improved semiconductor power device 1, the semiconductor power system 100 and the cooling method for; therefore, they do not constitute a complete list of all embodiments. Actual arrangements and methods may vary from the embodiments shown in terms of semiconductor power devices, for example.

REFERENCE SIGNS

1 semiconductor device
2 encapsulation
3 power module
4 baseplate
5 cooling unit
6 pin-fins
7 housing of the cooling unit
8 upper surface of the power module
9 lower surface of the power module
10 upper flow section

11 effective flow direction of the upper flow section
12 inlet of the upper flow section
13 outlet of the upper flow section
14 sectional flow direction
15 upper flow path
20 lower flow section
21 effective flow direction of the lower flow section
22 inlet of the lower flow section
23 outlet of the lower flow section
24 flow connecting section
25 lower flow path
26 sealing member
27 clamping element
100 semiconductor power system
A stacking direction of the power module
B lateral direction of the power module
C lateral direction of the power module
S(i) steps of a method for cooling the semiconductor power device/semiconductor power system

What is claimed is:

1. A semiconductor power system, comprising:
a plurality of semiconductor power devices, wherein each of the plurality of semiconductor power devices comprises
    a power module with an upper surface and a lower surface opposite to the upper surface,
    a housing that is arranged on the upper surface of the power module defining an upper flow section for liquid cooling of the power module in between, the upper flow section comprising an inlet, an outlet, and a given upper flow path in between, configured such that an effective upper flow direction is predefined,
    a cooling unit that is arranged on the lower surface of the power module defining a lower flow section for liquid cooling of the power module in between, the lower flow section comprises an inlet, an outlet, and a given lower flow path in between, configured such that an effective lower flow direction is predefined, such that during operation a coolant flows through the upper flow path and the coolant flows through the lower flow path providing a double-sided liquid cooling of the power module, wherein the effective upper flow direction is different from the effective lower flow direction,
    a baseplate forming a top wall of the cooling unit and supporting the lower surface of the power module,
wherein the plurality of semiconductor devices comprises a first semiconductor power and a second semiconductor power device,
wherein the lower flow section of the first semiconductor device is fluidically connected to the lower flow section of the second semiconductor device,
wherein the lower flow section of the second semiconductor power device is fluidically connected to the upper flow section of the second semiconductor power device, and
wherein the upper flow section of the second semiconductor power device is fluidically connected to the upper flow section of the first semiconductor power device by an outlet from the second semiconductor power device that feeds through the baseplate of the second semiconductor power device into a flow connection coupling pipeline positioned entirely sealed within the lower flow sections of the first and second semiconductor power devices, that is fluidically connected to an inlet to the first semiconductor power device that feeds through the baseplate of the first semiconductor power device into the upper flow section of the first semiconductor power device.

2. The semiconductor power system according to claim 1, wherein the effective upper flow direction and the effective lower flow direction are opposite or anti-parallel.

3. The semiconductor power system according to claim 1, further comprising an inlet to the lower flow sections and an outlet from the upper flow sections that are arranged at the same side of the semiconductor power system such that the upper flow paths and the lower flow paths form a U-shaped flow channel.

4. The semiconductor power system according to claim 1, wherein, in each of the plurality of semiconductor power devices each baseplate comprises a cooling structure with at least one of a pin-fin area, ribs, a skived structure, or meander channels that is arranged inside the lower flow path.

5. The semiconductor power system according to claim 1, wherein, in each of the plurality of semiconductor power devices, the upper flow path comprises a flow channel with a height that is at least 10% of a height of a flow channel of the lower flow path with respect to a stacking direction of the semiconductor power device from the lower flow section towards the upper flow section.

6. The semiconductor power system according to claim 1, wherein, in each of the plurality of semiconductor power devices, the housing is formed as a resin and/or gel encapsulation enclosing the power module and wherein the upper flow path is formed embedded in the encapsulation.

7. The semiconductor power system according to claim 1, wherein, in each of the plurality of semiconductor power devices, the upper flow path and/or the lower flow path are limited by walls comprising at least one of copper, copper alloy, aluminum, aluminum alloy, or an insulating material.

8. The semiconductor power system according to claim 1, wherein, in each of the plurality of semiconductor power devices, the power module comprises electronics and a substrate with metallization and an isolating sheet made of resin or ceramic.

9. The semiconductor power system according to claim 8, wherein, in each of the plurality of semiconductor power devices, the upper flow path is configured such that during operation the coolant is in thermal contact with at least one of the electronics and the metallization or the isolating sheet of the substrate.

10. The semiconductor power system according to claim 1, wherein, in each of the plurality of semiconductor power devices, the upper flow path comprises at least two flow channels separated from each other.

11. The semiconductor power system according to claim 1, wherein, in each of the plurality of semiconductor power devices, the upper flow section is configured such that a ceiling wall of the upper flow path is exposed from the housing.

12. The semiconductor power system according to claim 1, wherein the respective cooling unit of the first and the second semiconductor power device are formed as a common continuous cooler.

13. The semiconductor power system according to claim 12, further comprising at least one sealing member between the baseplate and the flow connection section.

14. A method for cooling a semiconductor power system that comprises a plurality of semiconductor power devices, each of the plurality of semiconductor power devices comprising a power module, a housing that is arranged on an upper surface of the power module defining an upper flow section for liquid cooling of the power module in between, the upper flow section comprising an inlet, an outlet, and a given upper flow path in between configured such that an effective upper flow direction is predefined, a cooling unit that is arranged on the lower surface of the power module defining a lower flow section for liquid cooling of the power module in between, the lower flow section comprising an inlet, an outlet, and a given lower flow path in between configured such that an effective lower flow direction is predefined, and a baseplate forming a top wall of the cooling unit and supporting a lower surface of the power module, the method comprising:

providing at least one coolant for liquid cooling of the power modules in the plurality of semiconductor power devices, feeding the at least one coolant into the lower flow path of the lower flow section of a first one of the plurality of semiconductor power devices, feeding the at least one coolant from the lower flow path of the lower flow section of the first semiconductor power device into the lower flow path of the lower flow section of a second one of the plurality of semiconductor power devices, feeding the at least one coolant from the lower flow path of the lower flow section of the second semiconductor power device into the upper flow path of the upper flow section of the second semiconductor power device, and feeding the at least one coolant from the upper flow path of the upper flow section of the second semiconductor power device through the baseplate of the second semiconductor power device into a flow connection coupling pipeline positioned entirely sealed within the lower flow sections of the first and second semiconductor power devices, and from the flow connection section through the baseplate of the first semiconductor power device into the upper flow path of the upper flow section of the first semiconductor power device, such that during operation the at least one coolant flows through the lower and the upper flow sections and provides a double-sided liquid cooling of the power modules, wherein the effective upper flow direction is different from the effective lower flow direction.

15. The method according to claim 14, wherein the effective upper flow direction and the effective lower flow direction are opposite or anti-parallel.

16. The method according to claim 14, wherein an inlet to the lower flow sections and an outlet from the upper flow sections are arranged at the same side of the semiconductor power system such that the upper flow paths and the lower flow paths form a U-shaped flow channel.

* * * * *